US006546618B1

(12) United States Patent
Yagawa

(10) Patent No.: US 6,546,618 B1
(45) Date of Patent: Apr. 15, 2003

(54) RIVET COUPLING DEVICE

(75) Inventor: Hiroshi Yagawa, Tokyo (JP)

(73) Assignee: Tyco Electronics AMP K.K., Kanagawa (JP)

( * ) Notice: Subject to any disclaimer, the term of this patent is extended or adjusted under 35 U.S.C. 154(b) by 0 days.

(21) Appl. No.: 09/575,996

(22) Filed: May 23, 2000

(30) Foreign Application Priority Data

May 24, 1999 (JP) .......................................... 11-143313

(51) Int. Cl.[7] .............................. B21J 15/10; B21J 15/14
(52) U.S. Cl. ............................ 29/832; 29/739; 29/753; 29/243.54; 100/264; 227/62; 227/155
(58) Field of Search .......................... 29/739, 747, 751, 29/753, 761, 837, 243.54, 524.1, 798, 243.53, 509, 283.5, 832, 838, 842, 844; 72/407, 408; 100/264; 227/61, 62, 155

(56) References Cited

U.S. PATENT DOCUMENTS

| 2,179,900 | A | * | 11/1939 | Sheane |
| 2,843,923 | A | * | 7/1958 | MacKenzie et al. |
| 4,237,566 | A | * | 12/1980 | Castiglioni |
| 4,399,988 | A | * | 8/1983 | De Shong |
| 5,263,627 | A | * | 11/1993 | Breuer et al. |
| 6,131,786 | A | * | 10/2000 | Kamps |

FOREIGN PATENT DOCUMENTS

| GB | 2145022 | * | 3/1985 |
| JP | 58-202921 | * | 11/1983 |

OTHER PUBLICATIONS

Patent Abstracts of Japan, Publication No.: 06277786, Application No. 05067999, Date of publication of application: Oct. 4, 1994, Date of filing: Mar. 26, 1993.

* cited by examiner

Primary Examiner—David P. Bryant
Assistant Examiner—Eric Compton

(57) ABSTRACT

A rivet coupling device 1 has a connector holder unit 250 which carries connectors 200 and a board 50. A supporting die 150 is disposed beneath the connectors 200, and an upper tool unit 92 is disposed above the connectors 200. The upper tool unit 92 can be lowered in order to couple rivets 220. In conjunction with this movement, a link mechanism 30 is actuated to move a cam plate 80, whereby the supporting die 150 is raised slightly by cam projections 148, so that the rivets 220 extending through the connector 200 are deformed between crimpers 134 on the upper tool unit 92 and the supporting die 150. Prior to rivet coupling, a slight gap is formed by the spring terminals between the board 50 and the connector 200. After rivet coupling is performed, this gap is eliminated without deforming the board 50.

18 Claims, 8 Drawing Sheets

FIG. 1

RIVET COUPLING DEVICE

FIELD OF THE INVENTION

The invention relates to a rivet coupling device which can fasten an electrical connector to a circuit board by means of rivets.

DESCRIPTION OF RELATED ART

The connection/fastening of a plurality of members by means of rivets is well-known. FIG. 8 shows a perspective view of a conventional rivet coupling device 300 as disclosed in Japanese Patent Application Kokai No. 6-277786.

This device 300 is used to fasten together a lever member 302 and a base member 304 with a rivet 306. The device 300 has a contact die 308 which supports the rivet 306 that extends through the members 302 and 304, and an insert main body 310 which deforms the rivet 306 by pressing the rivet 306 from above. During rivet installation, a tubular end part 312 at the tip of the insert main body 310 presses and deforms the tip 314 of the rivet 306, and a retaining member 318 which is driven by a spring 316 on the insert main body 310 presses and holds the members 302 and 304 in position.

However, in the case of the conventional rivet coupling device 300 disclosed in Japanese Patent Application Kokai No. 6-277786, the contact die 308 is fixed; accordingly, the deformation of the rivet tip will vary according to variations in the length of different rivets 306. As a result, there is a risk that the strength of the finished rivet will be insufficient to maintain the attachment of the members 302 and 304. Also, there is a risk that the finished rivet will be too short to allow relative movement between the members 302 and 304 where that is the intended case.

Furthermore, in cases where the members 302 and 304 are relatively large such that rivets are required in several places, if there is a gap between the members 302 and 304 and the contact die 308 is fixed, the upper member will be pressed and deformed by an amount corresponding to the gap. There is a risk that various problems will arise as a result of this deformation.

Furthermore, since rivet coupling is accomplished by the insert main body 310 acting directly on the contact die 308, inaccuracies occur in cases where there is a deviation in the positions of the members 302 and 304 being fastened. As a result, there is a possibility that the members 302 and 304 will be damaged, or that the coupling device 300 itself will be damaged.

SUMMARY OF THE INVENTION

The present invention was devised in light of the above points.

One object of the invention is to provide a rivet coupling device which performs highly reliable rivet attachments.

Another object of the invention is to provide a rivet coupling device which can perform rivet coupling without damage to the members being fastened.

Still another object of the invention is to provide a rivet coupling device which prevents damage to the device itself.

These objects are accomplished by a rivet coupling device for fastening an electrical connector to a substrate, wherein the electrical connector has spring terminals that elastically contact the substrate. The rivet coupling device has a supporting die that supports a head part on one end of a rivet, and a pressing die that is operable to deform an end portion on an other end of the rivet. The rivet coupling device is characterized in that the supporting die is carried on a cam plate which is operably connected to the pressing die by a link mechanism, wherein when the pressing die is moved toward the supporting die, the supporting die is driven by the cam plate toward the pressing die, whereby the end portion of the rivet is deformed and the spring terminals are compressed against the substrate.

According to one aspect, a movable carrying plate supports the electrical connector on a side opposite from the substrate.

According to another aspect, the link mechanism has a connecting part which separates when the carrying plate deviates from a specified position during rivet coupling.

In the rivet coupling device of the present invention, the supporting die is carried on a cam plate which is linked to the pressing die via a link so that the supporting die moves in linkage with the pressing die, and when the pressing die moves toward the supporting die, the supporting die is cam-driven by the cam plate so that the supporting die approaches the pressing die, thus causing the rivet to be deformed in a state in which the spring terminals of the electrical connector are compressed toward the board to which the electrical connector is attached. Accordingly, deformation of the board by pressing during the coupling work can be prevented. Thus, there is no danger that the printed wiring on the surface of the board will be broken. Furthermore, since the connector is pressed by both the pressing die and the supporting die, deformation or warping of the connector following molding can be corrected, so that appropriate coupling can be performed. Furthermore, coupling can be reliably performed regardless of any variation in the dimensions of the rivets, so that highly reliable fastening of the connector can be accomplished. In particular, in cases where a plurality of connectors are mounted, the board is expensive, and since coupling can be performed without wasting such expensive boards, the merit of the present invention in terms of cost is conspicuous.

Furthermore, the connector carrying plate of the rivet coupling device of the present invention is made movable, and the device is constructed so that the link has a connecting part that can be separated when the connector carrying plate deviates from a specified position. In such cases, inaccurate coupling can be prevented, and damage to the rivet coupling device can also be prevented.

BRIEF DESCRIPTION OF THE DRAWINGS

The invention will now be described by way of example with reference to the accompanying drawings wherein:

FIG. 1 is an overall perspective view of a rivet coupling device according to the invention;

DETAILED DESCRIPTION OF A PREFERRED EMBODIMENT

Figure 1:
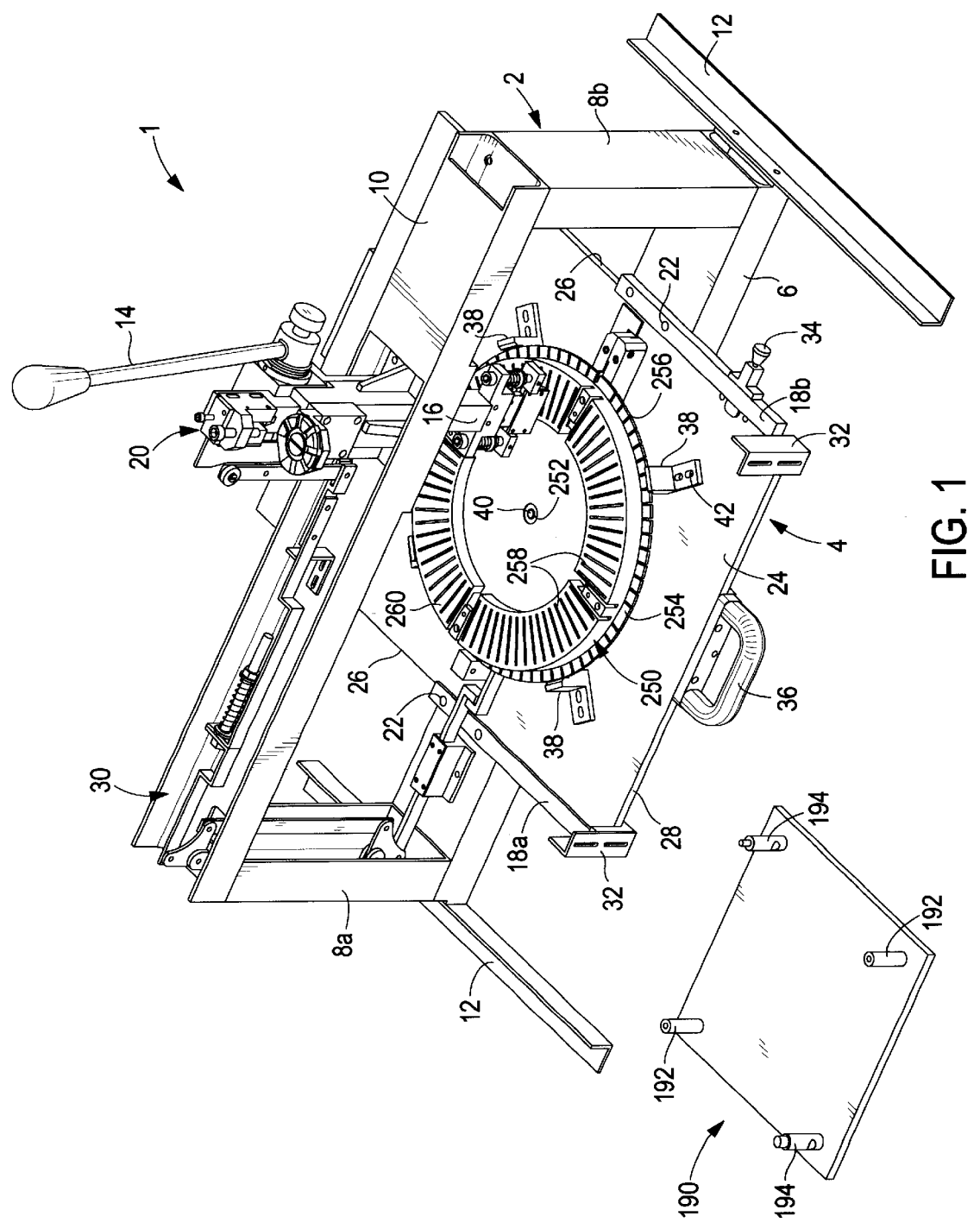
Figure 2A:
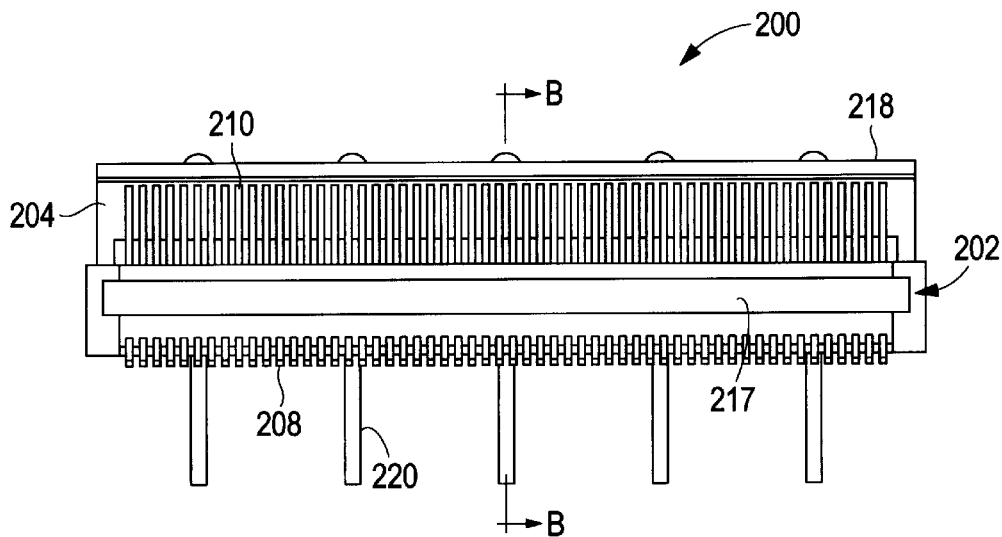
FIG. 2(A) is a front view of an electrical connector with which the rivet coupling device may be used.

As shown in FIG. 1, rivet coupling device 1 has a frame body 2 with a substantially rectangular external shape, a lower tool unit 4 which is installed in the frame body 2, and a connector carrying plate or connector holder unit 250 which is carried on the lower tool unit 4. The frame body 2 is preferably a metal beam structure having a long, slender base part 6, supporting columns 8a and 8b which are fastened in upright positions to both end of the base part 6, and an upper beam 10 which is installed and fastened in place so that it forms a bridge between the upper ends of the supporting columns 8a and 8b. Furthermore, supporting members 12 which extend perpendicular to the base part 6, and which are used to stabilize the frame body 2 in an upright position, are fastened to both ends of the base part 6.

A pressing unit 20 which performs the coupling of rivets 220 (described later, see FIG. 2) is fastened to the upper beam 10. A handle 14 is shaft-supported on the pressing unit 20 so that this handle 14 can pivot, and a ram 16 can be caused to slide upward and downward by rotating the handle 14. Details of this pressing unit 20 will be described later. When the pressing unit 20 is driven, a link mechanism 30 is operated whereby the holder unit 250 is positioned and coupling is performed. Details of this operation will be described later.

A pair of spaced-apart rails 18a and 18b are fastened to the base part 6 of the frame body 2 by means of bolts 22. Side edges 26, 26 of a rectangular main body 24 of the lower tool unit 4 are accommodated on the inside facing surfaces of the rails 18a and 18b so that the side edges 26, 26 are free to slide between the rails. The lower tool unit 4 can be maintained in a desired position by means of a locking pin 34 attached to the rail 18b that can prevent the main body 24 from sliding.

A handle 36 is disposed on the central part of the front edge 28 of the main body 24, and guides 32 used for a square board are attached to both ends of the front edge 28. These guides 32 can move upward and downward. The guides 32 have an L-shaped cross-section and are installed facing each other so that one inside surface of each guide is in the same plane. The guides 32 are used for positioning a square board as will be described later. When the lower tool unit 4 disposed between the rails 18a and 18b is to be pulled forward (with reference to FIG. 1), the locking pin 34 is pulled to release the engagement between the lower tool unit 4 and the locking pin 34, and the lower tool unit 4 is moved forward by pulling the handle 36.

Holder unit guides 38 are disposed on the main body 24 in four places at equal intervals around the holder unit 250. These guides 38 are fastened in place by screws 42. The guides 38 are constructed so that they accommodate the outer circumference of the holder unit 250, and are installed so that they face toward the center of the holder unit 250. A center pin 40 is disposed in an upright position on the main body 24 at the center of the guides 38. This pin 40 is inserted into a central hole 252 formed in the center of the mounted holder unit 250, thus supporting the holder unit 250 so that the holder unit 250 can rotate.

The holder unit 250 has a disk shape and has a flange 254 on its outer circumference. A plurality of grooves 256 which open to the outside of the flange 254 are disposed at specified intervals and in a radial configuration in the flange 254. A substantially annular connector carrying part 260 which protrudes upward is formed on the inside of the flange 254. A plurality of slots 258 which extend radially are formed at specified intervals in the upper surface of the connector carrying part 260. As will be described later, connectors 200 (FIG. 2) are carried in these slots 258. Furthermore, a square board stand 190, shown in FIG. 1, is a jig used to attach a board 50 (FIG. 2(C)) to the holder unit 250. Nuts 192 and positioning pins 194 are disposed in upright positions on respective diagonally opposite corners of the board stand 190.

Figure 2B:
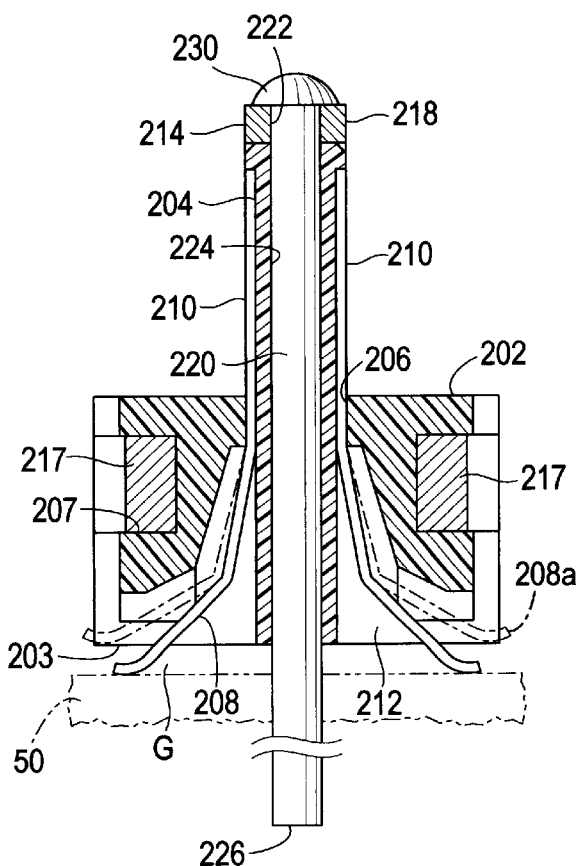
FIG. 2(B) is a cross-sectional view taken along line B—B in FIG. 2(A)

FIGS. 2(A) and 2(B) show an electrical connector 200 which can be rivet coupled to a substrate by the present invention. The connector 200 has a long, slender insulating housing 202, and terminals 210 which are disposed at specified intervals along a protruding wall 204 of the housing. The terminals 210 are fastened in place by a press-fit in terminal insertion holes 206 formed in the housing 202. Tine parts 208 of the terminals 210 are elastically deflected outward within lower cavities 212 in the housing 202 when the connector 200 is coupled to a circuit board or other substrate 50. Prior to coupling the connector 200 to the board 50, the tine parts 208 protrude below a bottom surface 203 of the housing 202. Accordingly, when the connector 200 is simply placed on the board 50, a slight gap G is created between the connector 200 and the board 50.

A long slender metal plate 218 which has a plurality of through-holes 222 is disposed on a top part 214 of the protruding wall 204. Rivets 220 are passed through the through-holes 222 in the metal plate 218 and the through-holes 224 in the housing 202. The width of the metal plate 218 and the external dimension of head parts 230 of the rivets 220 are set at dimensions that are smaller than the width of the slots 258 so that the metal plate 218 and the head parts 230 can enter the slots 258 without any interference. Furthermore, metal plates 217 are disposed within recesses 207 in the side parts of the housing 202, so that the surfaces of these metal plates 217 are perpendicular to the board 50.

Figure 2C:
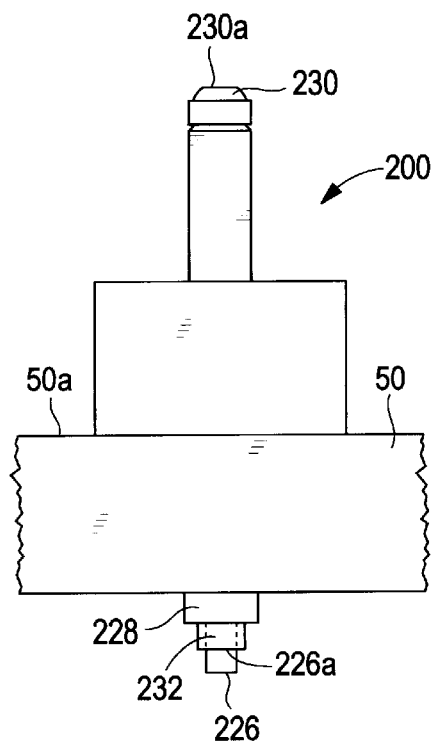
FIG. 2(C) is a side view which shows the electrical connector attached to a circuit board.

In FIGS. 2(A)–2(C), five rivets 220 are attached to the connector 200. This connector 200 is placed on the connector attachment surface 50a of the board 50, and the connector is fastened to the board 50 by pressing and deforming the tips 226 of the rivets 220, thus forming large-diameter tip ends 226a. In this case, a metal plate 228 similar to the metal plate 218 is disposed on the opposite side of the board 50, and the tips 226 are pressed and crushed against this metal plate 228. Accordingly, after coupling, the connector 200 and the board 50 are fastened together and held in compression between the head parts 230 and tip end parts 232 of the rivets 220. It should be noted that top portions 230a of the head parts 230 are slightly flattened following coupling, as shown in FIG. 2(C).

In this state, the tine parts 208 of the terminals 210 are in the positions indicated by phantom lines showing tine parts 208a in FIG. 2(B), and are engaged with the board 50 in an elastically pressed state. Accordingly, the connector is attached to the board 50 in a state in which the tine parts 208 are constantly pressed against conductive pads (not shown) on the board, so that the reliability of the electrical connections is high. Since the connector 200 is attached to the surface of the board 50 against the spring force of numerous spring terminals 210, the connector 200 requires a strength that is sufficient to prevent deformation of the connector 200 itself. Accordingly, the aforementioned metal plates 217, 218 and 228 are used to reinforce the connector.

Figure 3:
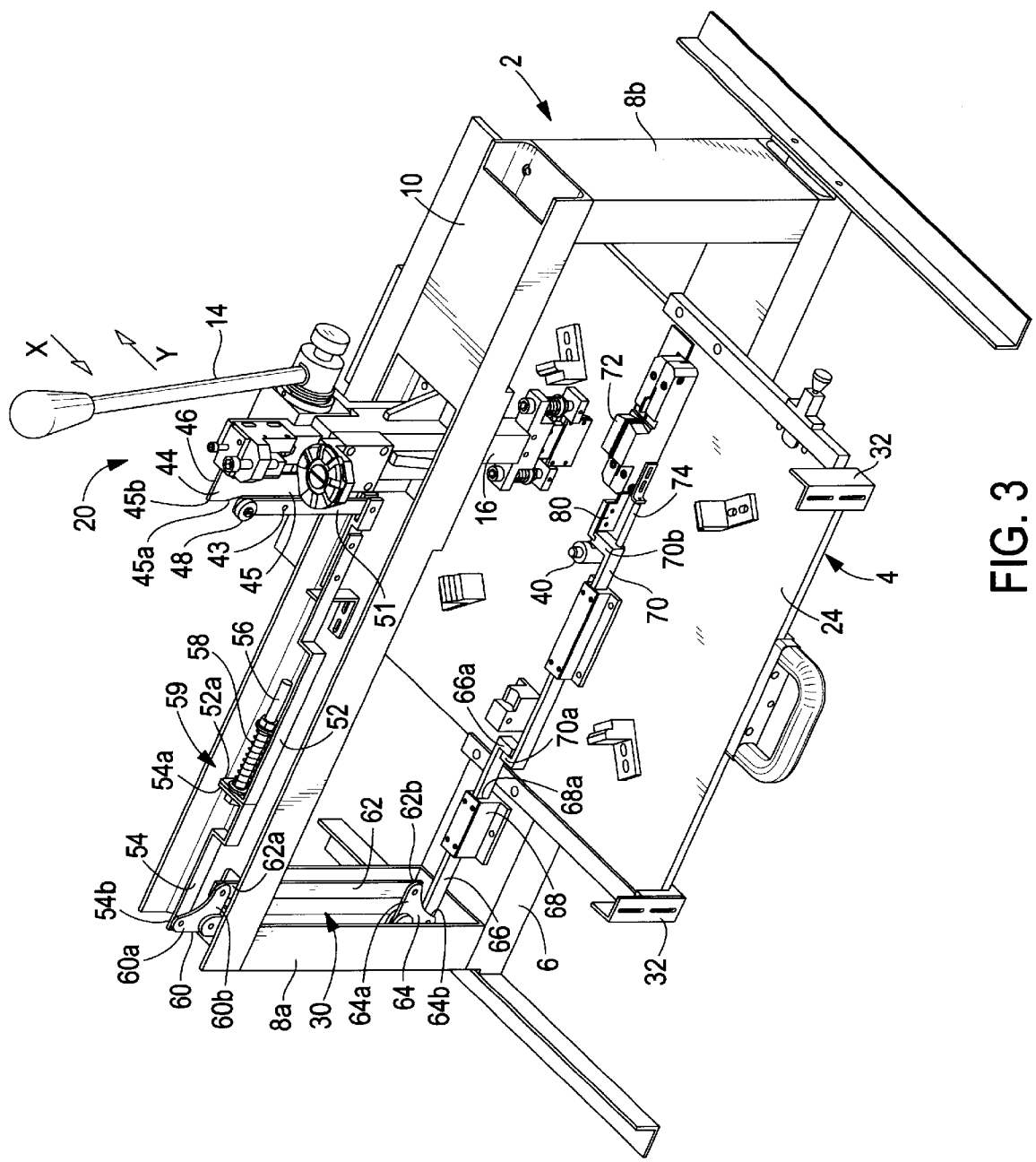
FIG. 3 is a perspective view similar to FIG. 1, showing the rivet coupling device without a connector holder unit.

FIG. 3 is a perspective view similar to FIG. 1, but with the holder unit 250 removed from the coupling device. The link mechanism 30 (FIG. 1) extends from the pressing unit 20 along the upper beam 10, and then along the supporting column 8*a* and base part 6 to the lower tool unit 4. A cam part 44 which is disposed in the vertical direction is installed on the pressing unit 20. A side edge 45 of this cam part 44 is constructed from an inclined transition part 45*a* and a side edge 45*b* which protrudes parallel to the sliding direction of the ram 16. A cam 46 is formed by the transition part 45*a* and the side edge 45*b*. A cam bar 51 is supported by a shaft 43 and has a roller or cam follower 48 installed on one end so that this roller 48 is free to rotate and is adjacent to the cam part 44. The cam bar 51 is pivot-mounted on a plate part (not shown) which forms an integral unit with the frame body 2. The cam bar 51 is constructed so that the roller 48 conforms to the shape of the side edge 45 and cam 46 when the cam part 44 moves.

The other end of the cam bar 51 is pivot-mounted on a beam 52 formed by bending a long, slender plate member. The tip end of the beam 52 forms a contact part 52*a* which is bent in an L shape, and is linked in a state of contact with a similar contact part 54*a* on the next adjacent beam 54. One end of a rod 56 is fastened to the contact part 54*a*, and this rod 56 passes through an opening in the contact part 52*a*, and extends along the beam 52. A compression coil spring 58 which is constrained at one end is disposed on an intermediate portion of the rod 56, so that the contact parts 52*a* and 54*a* are constantly driven into contact with each other. A first connecting part 59 of the link mechanism 30 is constructed from the contact parts 52*a* and 54*a*, rod 56 and compression coil spring 58.

The opposite end 54*b* of the beam 54 is pivot-mounted on one end 60*a* of an L-shaped crank 60 which is pivot-mounted on the end portion of the upper beam 10. One end 62*a* of a beam 62 disposed along the supporting column 8*a* is similarly connected to the other end 60*b* of the crank 60, and the other end 62*b* of this beam 62 is connected to one end 64*a* of a similar L-shaped crank 64 which is disposed at the lower end of the supporting column 8*a*. A rectilinear beam 66 which extends along the base part 6 is connected to the other end 64*b* of the crank 64. A guide block 68 is disposed at an intermediate point on the beam 66. A groove 68*a* which accommodates the beam 66 so that the beam 66 can slide is formed in the guide block 68. The position of the beam 66 is regulated by this groove 68*a*, and the sliding of the beam 66 is guided. The other end of the beam 66 is bent at a right angle so that an engaging part 66*a* is formed. The next adjacent beam 70 is positioned on the main body 24 of the lower tool unit 4; this beam 70 is positioned and guided by a guide block 72 similar to the guide block 68.

An engaging part 70*a* corresponding to the engaging part 66*a* of the beam 66 is formed on one end of the beam 70. This engaging part 70*a* acts so that when the beam 66 is pulled to the left, the two engaging parts 66*a*, 70*a* contact each other so that the beam 70 is pulled in the same direction. These engaging parts 66*a* and 70*a* constitute the second connecting part of the link mechanism 30. The beam 70 extends substantially parallel to the beam 66, and the other end of the beam 70 is formed as a bent part 70*b* which is bent in the same direction as the engaging part 70*a*. A cam plate 80 which extends substantially parallel to the beam 70 is fastened to this bent part 70*b*, and one end of a tension coil spring 74 is attached to the bent part 70*b*. The cam plate 80 is installed so that it can slide inside the guide block 72 which is fastened to the main body 24 of the lower tool unit 4, and the other end of the tension coil spring 74 is attached to this guide block 72. Accordingly, the beam 70 is spring-driven toward the right under ordinary conditions. Details of the cam plate 80 and holding body 72 will be described later.

Next, the operation of the link mechanism 30 will be described. When the handle 14 is rotated in the direction indicated by arrow X in order to perform rivet coupling, the cam part 44 which moves in linkage with the ram 16 is lowered, and the roller 48 of the cam bar 51 rides over the cam 46. Consequently, the cam bar 51 pivots in a counter-clockwise direction about the shaft 43. As a result, the beams 52 and 54 move to the right in the figure, and the beam 62 is caused to move downward via the crank 60. The movement of the beam 62 causes the beam 66 to move via the crank 64, so that the beam 66 is pulled to the left. The movement of the beam 66 is transmitted to the beam 70 as a result of the engaging part 66*a* contacting the engaging part 70*a*, so that the beam 70 and the cam plate 80 fastened to the beam 70 are similarly caused to move to the left against the spring force of the tension coil spring 74. As a result of the operation of this handle 14, a rivet 220 is deformed; the conditions of this deformation will be described later.

Furthermore, when the handle 14 is returned to its original position, i.e., when the handle 14 is rotated in the Y direction, the beams 52, 54, 62 and 66 move in the opposite directions from those described above, so that the beam 66 moves to the right. In this case, the engaging part 66*a* moves in a direction which releases engagement with the engaging part 70*a*; however, since the beam 70 and cam plate 80 are driven by the coil spring 74, these parts also move to the right.

Figure 4:
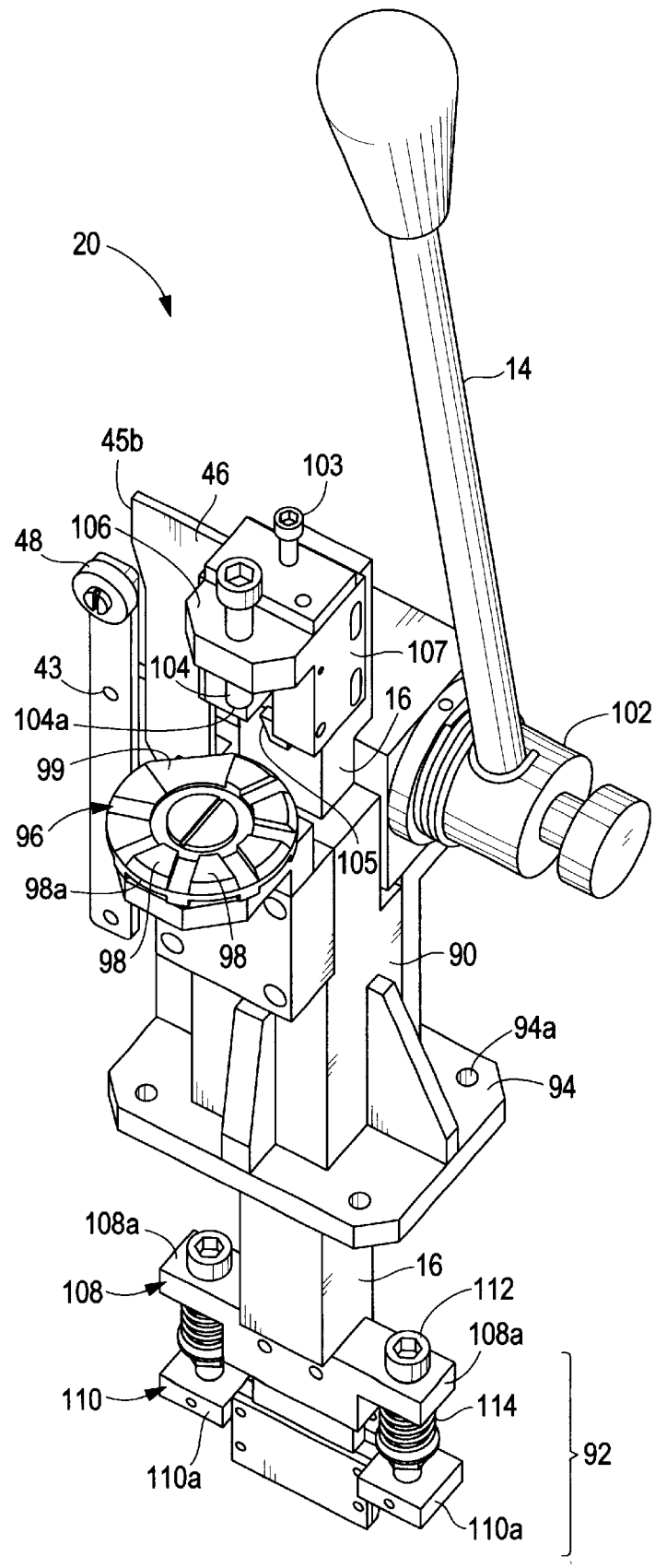
FIG. 4 is a perspective view of a pressing unit for the rivet coupling device.

FIG. 4 shows a perspective view of the pressing unit 20. The pressing unit 20 has a housing 90 which constitutes the main body of the pressing unit 20, a ram 16 which slides upward and downward through this housing 90, and an upper tool unit 92 which is attached to the lower end of the ram 16, and which constitutes the pressing die. A flange 94 which extends horizontally is disposed at the lower end of the housing 90. Bolts (not shown) are passed through holes 94*a* formed in this flange 94, so that the flange 94 is fastened to the upper beam 10 (FIG. 3). A disk-shaped adjustment dial 96 is attached to the upper part of the housing 90. A plurality of regions 98 which protrude upwardly to different heights are disposed along the circumference of the adjustment dial 96. This adjustment dial 96 is constructed so that specified regions 98 can be selected by means of a ratchet (not shown).

A rack (not shown) is formed on the back of the ram 16, and a pinion (not shown) which engages with this rack is formed on the rotating shaft 102 of the handle 14. Accordingly, as a result of the engagement of the rack and pinion, the rotational motion of the handle 14 is converted into rectilinear motion of the ram 16. The above-mentioned rack and pinion are disposed inside a gear box (not shown). A stopper 104 which regulates the length of the ram stroke is attached to the upper part of the ram 16. The stopper 104 is formed by a screw which is attached to a flange 106. When the ram 16 is lowered, the tip 104*a* of the stopper 104 contacts the surface of the selected region 98, so that further lowering of the ram 16 is prevented. In this way, the bottom dead center position of the ram is determined by the selected region 98 of the adjustment dial 96. The bottom dead center position can be adjusted within a range of +/−0.3 mm by appropriately selecting one of the regions 98. At the time that the device 1 is assembled, a block 107 which holds the stopper 104 is adjusted upward or downward with respect to the ram 16 by means of a bottom dead center adjustment screw 103 in order to determine relative positions of the ratchet 105 and stopper 104 that will insure that incomplete lowering of the ram 16 is prevented. In cases where the ratchet 105 engages with a protruding edge 98a of one of the regions 98 of the adjustment dial 96 so that the block 107 (or ram 16) cannot rise, the dial 96 is rotated, and the ratchet 105 is released from a region 99 which does not have a protruding edge.

The upper tool unit 92 at the lower end of the ram 16 has an upper member 108 which is directly fastened to the ram 16, and a lower member 110 which is attached to the upper member 108 via bolts 112 and compression coil springs 114. The upper member 108 and lower member 110 have respective flanges 108a, 108a and 110a, 110a that extend laterally from these members. The aforementioned bolts 112 are disposed between these flanges. Details of the upper tool unit 92 will be described later.

Figure 5:
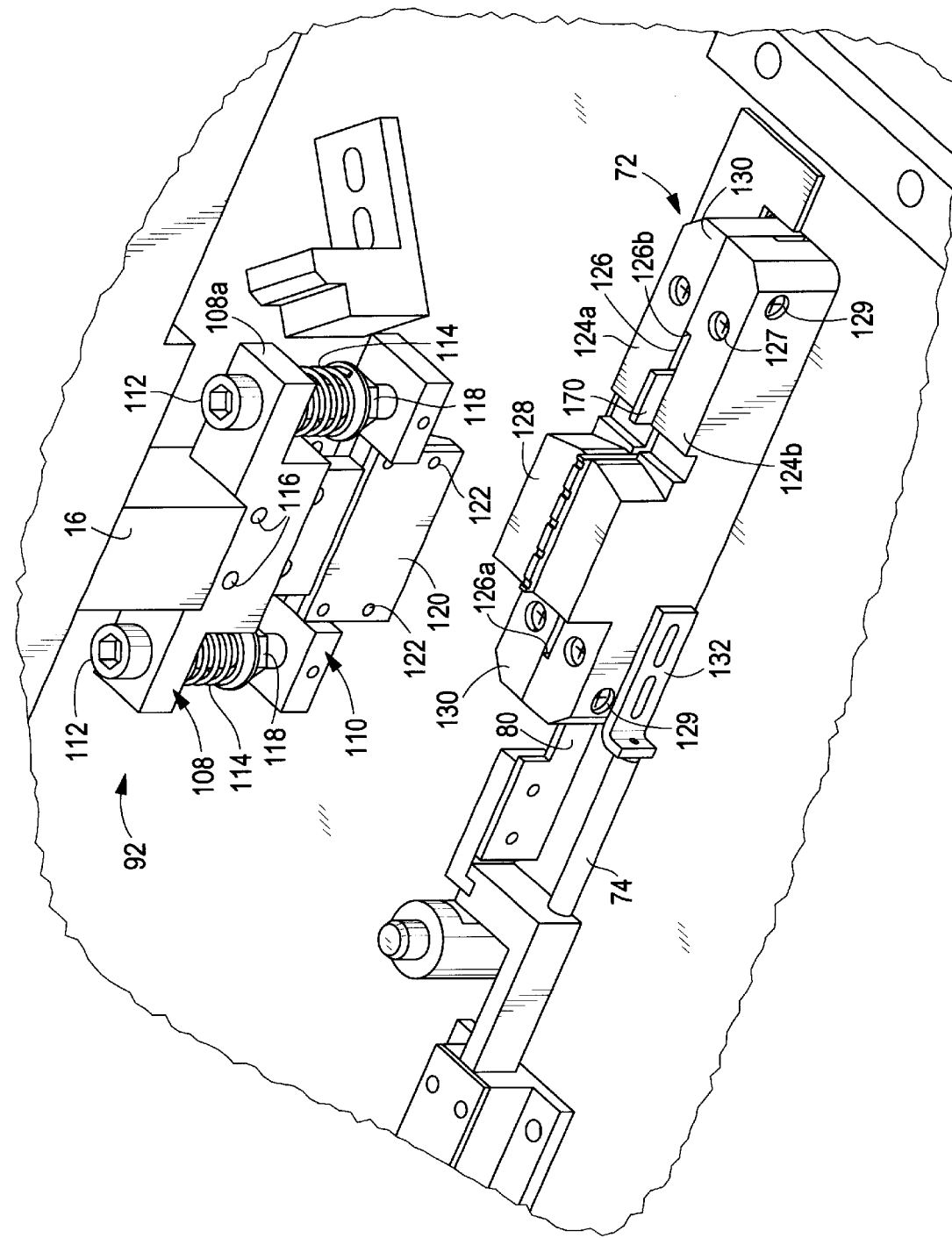
FIG. 5 is an enlarged perspective view which shows portions of an upper tool unit and a supporting body for the rivet coupling device.
Figure 6:
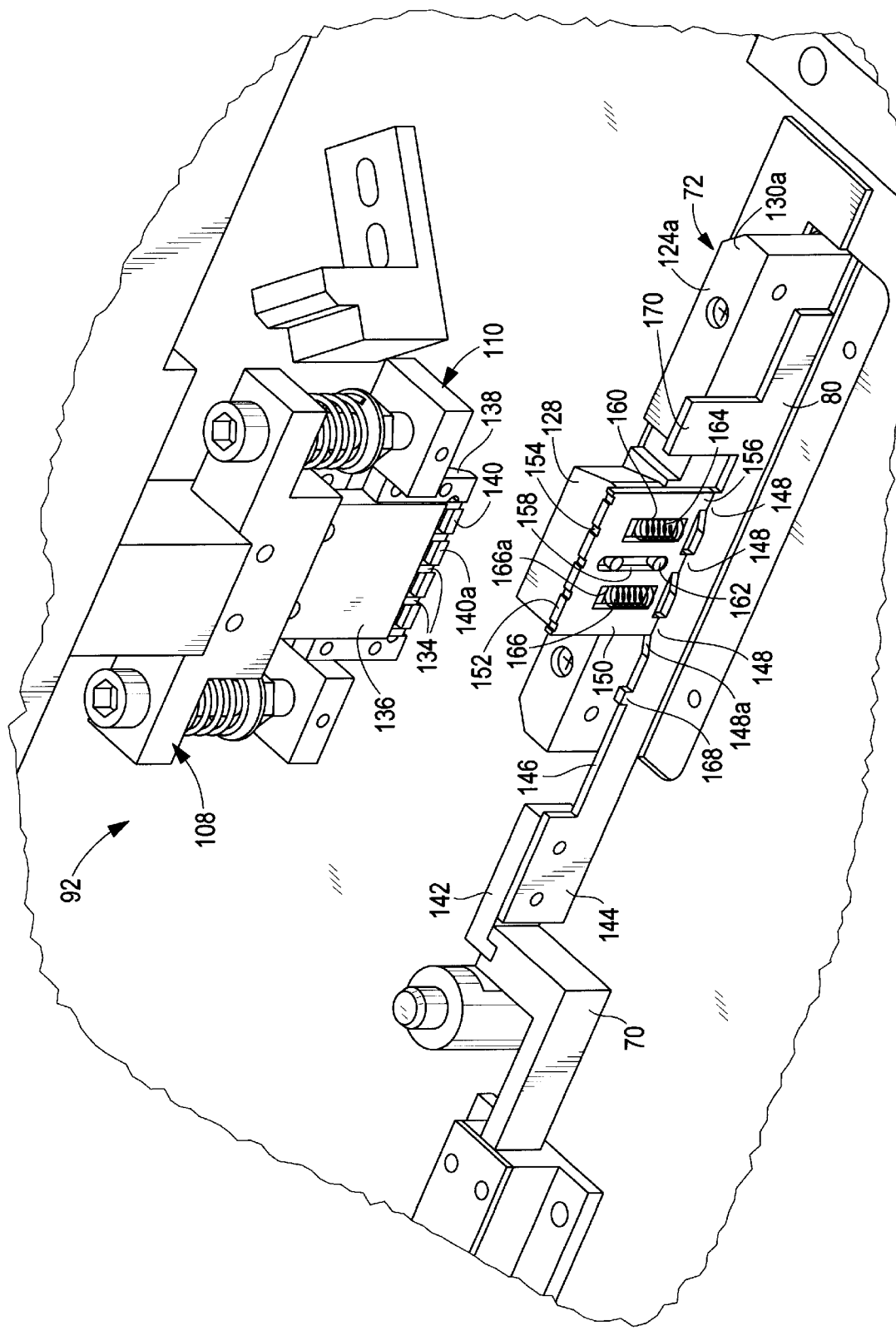
FIG. 6 is a perspective view similar to FIG. 5, showing the upper tool unit and supporting body in a partially disassembled state.

FIG. 5 is a perspective view of the upper tool unit 92 and holding body 72, and FIG. 6 is a perspective view (similar to FIG. 5) which shows the same upper tool unit 92 and holding body 72 as those shown in FIG. 5, with portions removed. The upper member 108 of the upper tool unit 92 is fastened to the ram 16 by means of screws 116. Nuts 118 are screwed onto intermediate portions of the bolts 112, and the springs 114 are disposed in a compressed state between these nuts 118 and the flanges 108a. The lower member 110 is driven downward by the springs 114, but is attached so that it can move toward the upper member 108. Specifically, since the bolt passage holes (not shown in the figures) formed in the upper member 108 are larger than the dimensions of the bolts 112, the lower member 110 can move upward by compressing the springs 114. A cover 120 which covers the crimper of the upper member 108 (described later) is attached to the lower member 110 by means of bolts 122.

The holding body 72 is constructed from two half-bodies 124a and 124b comprising metal blocks. The respective half-bodies 124a and 124b are fastened to each other by means of screws 129, and are fastened to the main body 24 by means of screws 127, so that a single holding body 72 is constructed. The half-bodies 124a and 124b act in conjunction to form a passage 126 for the installation of the cam plate 80 inside. In FIG. 5, a portion of an extension plate 170 of the cam plate 80 may be seen protruding from the interior of the passage 126. A pedestal 128 which protrudes toward the upper tool unit 92 and attachment parts 130 which are positioned on both sides of this pedestal 128 via step parts are formed in the holding body 72. The coil spring 74 is attached to the holding body 72 via an L-shaped bracket 132.

Next, the upper tool unit 92 and holding body 72 will be described in greater detail with reference to FIG. 6. When the cover 120 of the upper tool unit 92 is removed, the coupling parts of the upper member 108, i.e., the crimpers 134, are clearly shown. A plate part 136 which hangs downward from the upper member 108 is formed as an integral part of the upper member 108, and in the example shown in the figure, five crimpers 134 are formed on the end of the plate part 136 as integral parts of the plate part 136. The spacing of these crimpers 134 is the same as the spacing of the positions of the rivets 220 disposed in the aforementioned connector 200. Guide parts 138 which guide the plate part 136 and crimpers 134 are formed as integral parts of the lower member 110. The aforementioned cover 120 is also used to guide the plate part 136. The ends of the crimpers 134 are flat, and the crimpers are guided by ribs 140 which are positioned at the lower ends of the guide parts 138. When the crimpers 134 perform rivet coupling inside the ribs 140, the crimpers 134 are slightly lowered; however, the crimpers 134 do not protrude downward beyond the undersurfaces 140a of the ribs 140.

The cam plate 80 is screw-fastened to a bracket 142 at one end, and is further fastened to the beam 70 via this bracket 142. The cam plate 80 has a plate shape that extends rectilinearly from a wide attachment part 144 to the other end of the cam plate. Cam projections 148 in the upper edge 146 of the cam plate 80 have inclined surfaces 148a which are inclined toward the attachment part 144. A plate-like anvil 150 which acts as a supporting die is disposed in a gap between the cam plate 80 and the pedestal 128 facing the cam projections 148. Recesses 154 which have flat bottoms are formed in five locations in the upper edge 152 of the anvil 150 in positions corresponding to the crimpers 134. Three leg parts 156 are formed on the lower end of the anvil 150 in positions corresponding to the cam projections 148.

A slot 158 which extends upward and downward is formed in the center of the anvil 150, and slots 160 which extend upward and downward are similarly formed on both sides of the slot 158. Two separated bosses 162 which protrude from the pedestal 128 of the half-body 124a are disposed inside the slot 158 at both ends of the slot 158 with a slight amount of room to spare, so that the anvil 150 can be moved upward and downward. Compression coil springs 164 which drive the anvil 150 downward are disposed inside the slots 160. Specifically, recesses 166 which accommodate the coil springs 164 are formed in the pedestal 128. The upper ends of the coil springs 164 contact the downward-facing upper ends 166a of these recesses 166, and the lower ends of the coil springs 164 press against the lower ends of the slots 160, so that the anvil 150 is driven downward. Similar recesses 166 are also formed in the half-body 124b (although not shown in the figures).

An upward-facing rectangular projection 168 is formed in the upper edge 146 of the cam plate 80 to the left of the cam projections 148. This projection 168 contacts a stopping surface 126a (FIG. 5) of the passage 126, so that movement of the cam plate 80 to the rear (toward the left in FIGS. 5 and 6) is checked. Furthermore, an extension plate 170 which protrudes upward from the upper surface 130a of the attachment part 130 is formed on the right side of the upper edge 146. This extension plate 170 contacts a stopping surface 126b (FIG. 5) of the passage 126 so that further movement of the cam plate 80 to the front (toward the right in FIGS. 5 and 6) is checked.

The anvil 150 is shown in the figures in a state in which this anvil 150 has been pushed upward by the cam projections 148 when the cam plate 80 has moved to the left. In other words, the device is constructed so that when the handle 14 is pivoted to the front and rivet coupling is performed, the anvil 150 is pushed up from the pedestal 128 against the coil springs 164. During rivet coupling, the head parts 230 of the rivets 220 are carried in the recesses 154 of the anvil 150. The details of rivet coupling will be described later.

Figure 7:
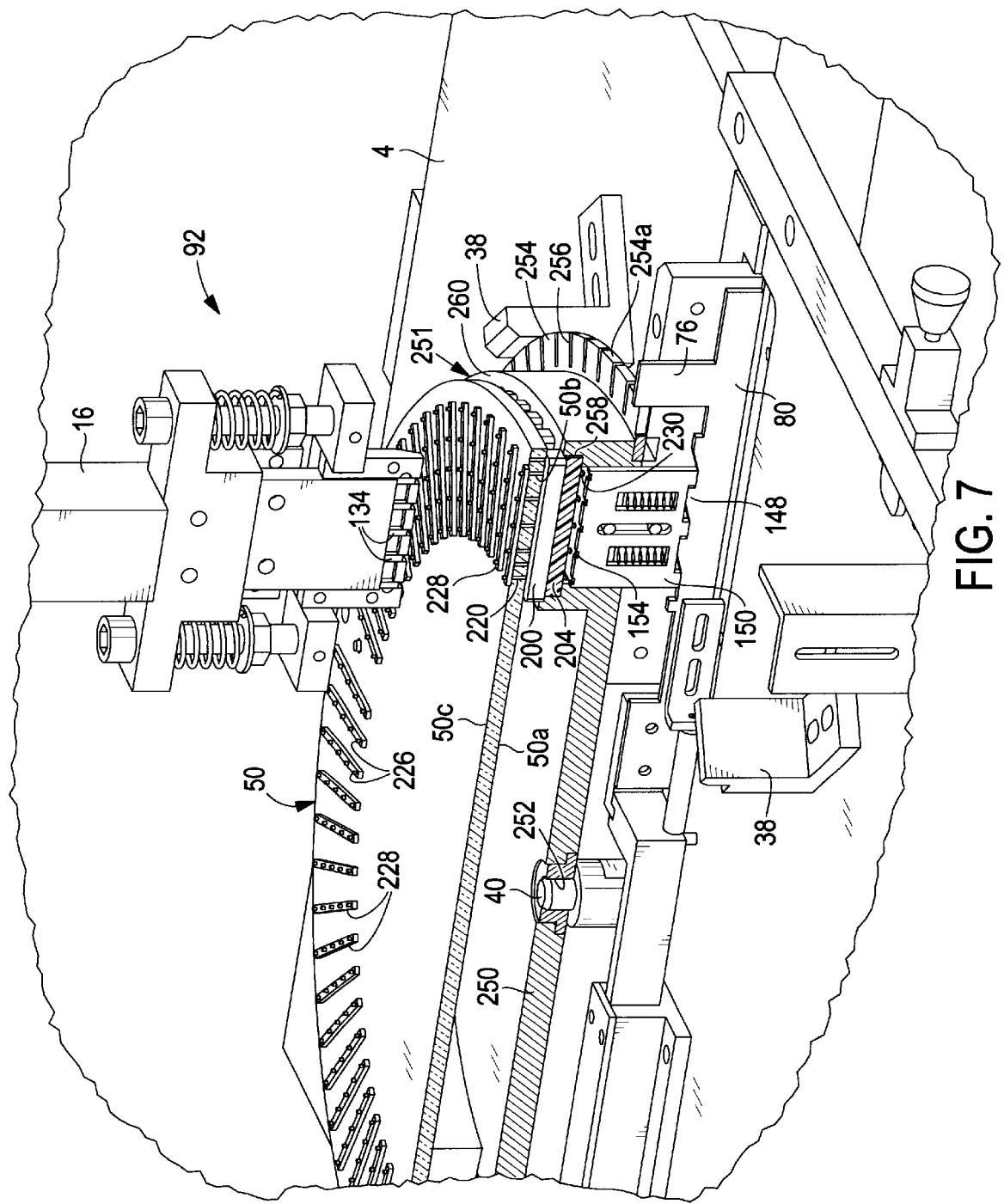
FIG. 7 is a partial cross-sectional perspective view of the rivet coupling device in which a circuit board and connectors are mounted in the connector holder unit.
Figure 8:
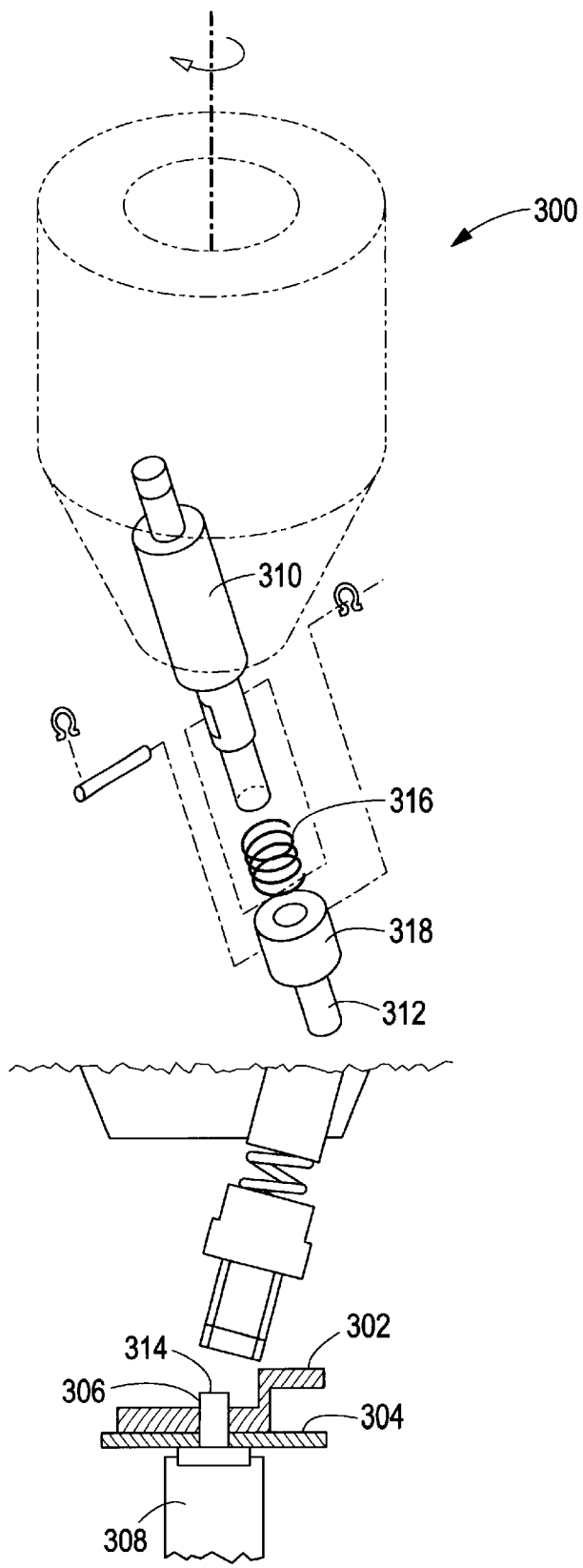
FIG. 8 is a perspective view of a conventional rivet coupling device.

Next, FIG. 7 shows a partial cross-sectional enlarged perspective view of the device 1 in a state in which a board 50 and connectors 200 are mounted in the holder unit 250. Furthermore, in FIG. 7, as in FIG. 6, the tool assembly 92 is shown with the cover 120 removed. The procedure by which the board 50 and connectors 200 are set in the device 1 will be described with reference to FIGS. 1 and 2 as well.

First, the board stand 190 shown in FIG. 1 is prepared. The board 50 is placed on this board stand 190 with holes (not shown) in the circular board 50 (FIG. 7) aligned with the positioning pins 194. In this case, the board 50 is placed with the connector attachment surface 50a of the board 50 facing upward.

Next, the connectors 200 are disposed on the board 50 in a radial arrangement along the outer circumference of the board 50. In this case, the ends 226 of the rivets 220 of the connectors 200 are disposed so that they pass through the through-holes 50b formed in the board 50. The connectors 200 are disposed on the board 50 so that they float above the board 50 by a gap G as shown in FIG. 2(B).

Next, the holder unit 250 is set on the connectors 200 using the aforementioned positioning pins 194 of the board stand 190 as guides. In this case, the connectors 200 are disposed so that the protruding walls 204 of the connectors 200 are inserted into the slots 258 of the holder unit 250. Then, the board 50 and holder unit 250 are lightly fastened by means of screws (not shown) so that the two parts are constructed as a sub-assembly 251. Handling is facilitated by this construction of a sub-assembly 251.

Next, in a state in which the handle 14 of the device 1 is pushed over to the rear from a vertical position, the locking pin 34 (FIG. 1) is pulled, and the lower tool unit 4 is pulled toward the front along the rails 18a and 18b.

Next, the sub-assembly 251 of the board 50 and the holder unit 250 is removed from the board stand 190 and is set on the lower tool unit 4 with the board 50 on top. At this time, the board 50 is in the state shown in FIG. 7, with the undersurface 50c of the board 50 facing upward. Then, the holder unit 250 is set using the four guides 38 (see FIGS. 1 and 7), and the center pin 40 is inserted into the central hole 252, so that attachment is easily accomplished.

Next, the metal plates 228 are set on the ends 226 of the rivets 220 protruding from the undersurface 50c of the board 50. In a state in which the handle 14 is pushed over to the rear from a vertical position, the lower tool unit 4 is pushed inward along the rails 18a and 18b, and the locking pin 34 is pushed so that the lower tool unit 4 is locked. As a result, the preparations for rivet coupling are completed. It is seen in FIG. 7 that the protruding walls 204 of the connectors 200 are disposed inside the slots 258 of the holder unit 250. Furthermore, the head parts 230 of the rivets 220 are positioned in the recesses 154 of the anvil 150.

Next, the connector 200 whose rivets 220 are to be coupled is moved by rotating the holder unit 250 and board 50 so that this connector 200 is positioned beneath the upper tool unit 92.

The coupling height of the rivets 220 is then adjusted. This is accomplished by rotating the adjustment dial 96 so that a region 98 with the desired height is selected.

Next, the handle 14 is pivoted toward the front so that the ram 16 is lowered, and the rivets 220 are pressed by the crimpers 134 so that the ends 226 are deformed. In this case, as was described above, the link mechanism 30 is actuated by the operation of the handle 14, so that the cam plate 80 moves to the left. Accordingly, the anvil 150 is pushed upward by the cam projections 148 so that the head parts 230 of the rivets 220 are pushed upward. Consequently, the rivets 220 are coupled in a state in which the rivets 220 are pressed by both the anvil 150 and crimpers 134. The timing of the movements of the pressing die 92 and anvil 150 is set so that lowered pressing die 92 initiates coupling when the anvil 150 has risen. The pressing force of the pressing die 92 and anvil 150 is approximately 10 kg, which is greater than the force of approximately 8 kg that is required for the compression of the spring terminals 210; accordingly, the spring terminals 210 are pressed against the board 50 so that the gap G is eliminated.

If the anvil 150 were fixed, the force of the crimpers 134 would also be applied to the board 50 when the crimpers 134 press the ends 226 of the rivets 220 during rivet coupling. Accordingly, the board portions of the coupled connectors 200 would be deformed downward. To describe this in greater detail, the tine parts 208 of the connectors 200 protrude elastically from the bottom surface 203 of the housing 202. Accordingly, in the state shown in FIG. 7, the board 50 is carried on the connectors 200 in which the bottom surface 203 of each connector 200 floats slightly as described above. Consequently, if the board 50 is pushed by the crimpers 134, the board 50 is deformed downward by a distance equal to the gap of the abovementioned floating so that the board 50 is pressed against the housing. As a result, there is a danger that circuits (not shown in the figures) formed on the board 50 by conductive traces, etc., will be broken. However, as a result of the anvil 150 moving upward, the board 50 is supported via the connectors 200 so that deformation of the board 50 is prevented.

To describe this in even greater detail, each connector 200 is caused to move toward the upper tool unit 92 with the recesses 154 in the anvil 150 supporting the head parts 230 of the rivets 220, and the portions of the upper edge 152 located between the recesses 154 supporting the metal plate 218. Accordingly, partial deformation of the board 50 can be prevented, so that there is no danger that printed circuits will be broken. Furthermore, the anvil 150 presses and supports the top part 214 of each connector 200 substantially uniformly. Accordingly, even in cases where slight deformation or warping of the connectors 200 occurs after molding, dimensional errors caused by such deformation can be compensated for, so that appropriate rivet coupling can be performed. In other words, warping of the connectors 200 can be corrected so that accurate rivet coupling can be performed. Furthermore, since the head parts 230 of the rivets 220, which have a height of approximately 0.6 mm, are positioned inside the recesses 154 of the anvil 150, which have a depth of approximately 0.4 mm, excessive crushing of the head parts 230 is prevented. The head parts 230 of five rivets 220 are pressed by this coupling operation, so that the head parts have similar flat shapes.

During rivet coupling, the extension plate 76 enters the corresponding groove 256 in the flange 254 of the holder unit 250, to ensure that the holder unit 250 is correctly angularly positioned. In cases where the holder unit 250 is not correctly positioned, the extension plate 76 contacts the outer edge 254a of the flange 254 so that the cam plate 80 does not move to the left, and the anvil 150 does not rise. If the handle 14 is pivoted under these conditions, the link mechanism may be damaged. Accordingly, the coil spring 58 shown in FIG. 3 is provided. When a force greater than the spring force of the coil spring 58 linking the beams 52 and 54 is applied, the coil spring 58 is compressed by the beam 52, so that the contact parts 54a and 52a are separated, thus ensuring that no excessive force is transmitted beyond the beam 54. Accordingly, damage to the link mechanism 30 is prevented.

An embodiment in which the board 50 is circular has been described; however, the present device 1 can also be used with a square board (not shown in the figures). A square board can be installed in the lower tool unit 4 by inclining the board so that a rear end of the board is higher, and two front corners of the board are engaged against square board guides 32 located in two places on the front side of the main body 24, thereby positioning the board. Next, the rear end of the square board is lowered. Specifically, if such a square board is arranged so that it is parallel to the main body 24, the central hole 252 of the connector holder unit 250 on which the square board is placed and the center pin 40 can be aligned, so that the square board can easily be attached to the main body 24. Following mounting on the main body 24, the square board guides 32 are lowered so that they do not interfere with the square board; accordingly, the system is arranged so that the square board can be rotated without any impediment. In the case of a square board as well, the connectors 200 are mounted in a radial configuration, and rivet coupling operations are performed one at a time by rotating the board about the center pin 40 in the same manner as in the case of a disk-shaped board 50. In the case of a square board, there is a wide space outside of the region in which the connectors 200 are disposed; accordingly, numerous mounted parts of various types can be carried in this space on the board.

Furthermore, in the embodiment described above, the engaging parts 66a and 70a comprising the second connecting part are both L-shaped parts. However, it would also be possible to construct the invention with only one L-shaped engaging part, while the other part is a plate spring which has a hole that engages with the end of the L-shaped engaging part. In such a case, even if the end of the L-shaped engaging part collides with the plate spring due to misalignment, damage to the engaging part or the plate spring will be avoided as a result of the elastic deformation of the plate spring.

I claim:

1. A rivet coupling device for fastening an electrical connector to a substrate with a rivet, wherein the electrical connector has spring terminals that elastically contact the substrate, the rivet coupling device having a supporting die that supports a head part on one end of the rivet, and a pressing die that is operable to deform an end portion on an other end of the rivet, the rivet coupling device being characterized in that:

the supporting die is carried on a cam plate which is operably connected to the pressing die by a link mechanism, wherein when the pressing die is moved toward the supporting die, the supporting die is driven by the cam plate toward the pressing die, whereby the end portion of the rivet is deformed and the spring terminals are compressed against the substrate.

2. The rivet coupling device according to claim 1, wherein a movable carrying plate supports the electrical connector on a side opposite from the substrate.

3. The rivet coupling device according to claim 2, wherein the link mechanism has a connecting part which separates when the carrying plate deviates from a specified position during rivet coupling.

4. The rivet coupling device of claim 1, wherein the supporting die has recesses for receiving the head part of the rivet.

5. The rivet coupling device of claim 1, wherein the pressing die and the supporting die have substantially the same pressing force.

6. The rivet coupling device of claim 5, wherein the pressing force is approximately 10 kg.

7. The rivet coupling device of claim 2, wherein the moveable carrying plate rotates to position the rivet on the supporting die.

8. A rivet coupling device, comprising:

a supporting die that supports an assembly having a rivet;

a pressing die positioned substantially adjacent to the supporting die, the pressing die moves between a first position and a second position where the pressing die engages the rivet and deforms an end portion of the rivet to couple the assembly; and a link mechanism that operably connects the supporting die to the pressing die, the link mechanism moves the supporting die and the rivet toward the pressing die as the pressing die moves to the second position.

9. The rivet coupling device of claim 8, wherein the supporting die is carried on a cam plate.

10. The rivet coupling device of claim 8, wherein the supporting die has recesses for receiving a head portion of the rivet.

11. The rivet coupling device of claim 8, wherein the pressing die and the supporting die have substantially the same pressing force.

12. The rivet coupling device of claim 8, wherein the assembly includes an electrical connector having a terminal and a circuit board having a conductive pad positioned adjacent to the terminal.

13. The rivet coupling device of claim 8, wherein a gap is formed between the circuit board and the electrical connector by tine parts of the terminal before the assembly is coupled.

14. The rivet coupling device of claim 13, wherein the electrical connector is positioned adjacent to the supporting die and the circuit board is positioned adjacent to the pressing die.

15. The rivet coupling device of claim 8, wherein the assembly is positioned on a holder unit and the holder unit rotates to position the rivet on the supporting die.

16. The rivet coupling device of claim 15, wherein the linking mechanism has a connecting part that separates when the holder unit does not correctly position the rivet on the supporting die to prevent damage to the linking mechanism.

17. A method for coupling an electrical connector to a circuit board with a rivet, comprising:

positioning the electrical connector and the circuit board on a supporting die such that a terminal extending from the electrical connector engages a conducting pad on the circuit board and a head of the rivet engages the supporting die;

actuating a linking mechanism to drive a pressing die toward the rivet as the supporting die drives the electrical connector and circuit board toward the pressing die; and coupling the electrical connector to the circuit board by deforming an end portion of the rivet with the pressing die.

18. The method of claim 17, wherein a gap is formed between the circuit board and the electrical connector by tine parts of the terminal before coupling and the electrical connector is positioned adjacent to the supporting die.

* * * * *